(12) United States Patent
Dono et al.

(10) Patent No.: US 7,796,456 B2
(45) Date of Patent: Sep. 14, 2010

(54) SEMICONDUCTOR DEVICE

(75) Inventors: Chiaki Dono, Tokyo (JP); Yasuji Koshikawa, Tokyo (JP); Masayuki Nakamura, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 227 days.

(21) Appl. No.: 11/616,755

(22) Filed: Dec. 27, 2006

(65) Prior Publication Data

US 2008/0089160 A1 Apr. 17, 2008

(30) Foreign Application Priority Data

Oct. 11, 2006 (JP) .............................. 2006-277564

(51) Int. Cl.
*G11C 17/18* (2006.01)

(52) U.S. Cl. ............... 365/225.7; 365/200; 365/189.08; 365/195

(58) Field of Classification Search .............. 365/225.7, 365/189.08, 195, 200
See application file for complete search history.

(56) References Cited

U.S. PATENT DOCUMENTS

| | | | | |
|---|---|---|---|---|
| 4,812,675 A * | 3/1989 | Goetting | ......................... | 326/8 |
| 4,887,239 A * | 12/1989 | Turner | .................... | 365/185.04 |
| 5,329,488 A * | 7/1994 | Hashimoto | ............. | 365/185.09 |
| 5,446,864 A * | 8/1995 | Burghardt et al. | ........... | 711/100 |
| 5,451,912 A * | 9/1995 | Torode | ................... | 331/108 C |
| 5,465,341 A * | 11/1995 | Doi et al. | ....................... | 714/30 |
| 5,495,447 A * | 2/1996 | Butler et al. | ................. | 365/200 |
| 5,821,770 A * | 10/1998 | Rees | ........................... | 326/38 |
| 6,016,264 A * | 1/2000 | Lin | .............................. | 365/96 |
| 6,088,281 A * | 7/2000 | Miyakawa et al. | ........ | 365/225.7 |
| 6,292,422 B1 * | 9/2001 | Pitts | ......................... | 365/225.7 |
| 6,302,729 B2 * | 10/2001 | Mockel et al. | .............. | 439/516 |
| 6,363,020 B1 * | 3/2002 | Shubat et al. | .............. | 365/200 |
| 6,396,760 B1 * | 5/2002 | Behera et al. | ............. | 365/225.7 |
| 6,486,526 B1 * | 11/2002 | Narayan et al. | ............. | 257/529 |
| 6,590,814 B1 * | 7/2003 | Kwak | .......................... | 365/200 |
| 6,608,792 B2 * | 8/2003 | Pitts | ......................... | 365/225.7 |
| 6,697,907 B1 * | 2/2004 | Roohparvar | ................. | 711/103 |
| 6,704,228 B2 * | 3/2004 | Jang et al. | .................... | 365/200 |
| 6,741,509 B2 * | 5/2004 | Kato et al. | .................... | 365/200 |
| 7,106,627 B2 * | 9/2006 | Shibata et al. | ......... | 365/185.04 |
| 7,174,477 B2 * | 2/2007 | Derner et al. | ................... | 714/7 |
| 7,180,764 B2 * | 2/2007 | Kim et al. | ...................... | 365/94 |
| 7,271,988 B2 * | 9/2007 | Chung et al. | ................... | 361/56 |
| 7,512,760 B2 * | 3/2009 | Takami | ........................ | 711/163 |
| 7,623,378 B1 * | 11/2009 | Wahlstrom et al. | ...... | 365/185.04 |

FOREIGN PATENT DOCUMENTS

EP 000542592 A1 * 5/1993
JP 2002-42472 A 2/2002

* cited by examiner

*Primary Examiner*—Viet Q Nguyen
(74) *Attorney, Agent, or Firm*—Sughrue Mion, PLLC

(57) ABSTRACT

A semiconductor device is configured to prevent misprogramming of fuse circuits therein. The semiconductor device includes the following elements. A group of fuse element circuits 911 is configured to store a first data defining the circuit configuration. A fuse element circuit 913 is configured to store a second data representing inhibition of programming the group of fuse element circuits. A control logic circuit 140 is configured to program the first and the second data on the fuse element circuits. An AND gate circuit 914 is configured to inhibit the control logic circuit 140 from programming the group of fuse element circuits 911 on condition that the fuse element circuit 913 has been programmed.

10 Claims, 13 Drawing Sheets

SEMICONDUCTOR DEVICE

BACKGROUND OF THE INVENTION

1. Field of the Invention

The present invention relates to a semiconductor device, and more specifically to a technology for preventing rewriting of a fuse circuit in which data defining inside circuit configuration is stored.

Priority is claimed on Japanese Patent Application No. 2006-277564, filed Oct. 11, 2006, the content of which is incorporated herein by reference.

2. Description of the Related Art

Formerly, semiconductor devices provided with fuse circuits for storing data which define the structure, such as word organization or redundancy structure, of inner circuits have been known. Among those semiconductor memories represented by dynamic random access memories (DRAMs), for example, there are product specifications in which the word organization of output data is ×4-bit organization, ×8-bit organization or the like. In order to cope with such plural product specifications, the fuse circuits inside the semiconductor devices are programmed before or after assembling packages in a manufacturing plant, so that the word organization of input and output data can be modified.

In these type of semiconductor memories, for example, in the default state, that is, the fuse circuit is unprogrammed, the word organization is set to ×8-bit organization, and the word organization is modified to ×4-bit organization by programming the fuse circuit. Accordingly, by testing the product as one having ×8-bit organization in the final screening test and then by programming the fuse circuit before shipping the product, a product in which the word organization complies with the demand of customers can be provided promptly. Moreover, since it becomes unnecessary to manufacture plural types of products having different word organizations, the total stock and accompanying cost can be reduced. Further, when the products are tested as ones having ×8-bit organization, testing time can be reduced by half compared with the case in which products are tested as ones having ×4-bit organization, so that accompanying cost can also be reduced.

Generally, what is called an anti-fuse is used as the above-described fuse circuit. The anti-fuse is a type of fuse which is electrically programmable and has such characteristics that it is normally in a high-resistance state (or open state), and is turned to a low-resistance state (or short circuit state) when a predetermined program voltage is applied (see Japanese Unexamined Patent Application No. 2002-42472). By using this anti-fuse, the fuse circuit of a semiconductor memory can be programmed even after it is assembled as a package. This type of fuse circuit is programmed before the semiconductor memory is shipped from the manufacturing plant by using a special command which is not open to users, and the users are not allowed to program the fuse circuit.

However, according to the above-described prior art, there is a possibility that after the semiconductor memory is shipped as a product from the manufacturing plant, a wrong timing signal, for example, may be applied to an external terminal of the semiconductor memory, so that the above-described special command to program the fuse circuit may be entered accidentally. In such a case, the circuit configuration of the product is modified contrary to the user's intention. In the above-described example, the word organization is modified to ×4-bit organization and consequently, the semiconductor memory becomes defective as a ×8-bit organization product.

This problem will be described in detail with reference to FIGS. 12 and 13. FIG. 12 illustrates a configuration of a conventional fuse circuit 10. In FIG. 12, 10-0, 10-1, . . . , 10-2 are fuse element circuits including anti-fuses. Among these circuits, the fuse element circuit 10-0 is to be programmed when the voltage of the internal electrical power source is adjusted, the fuse element circuit 10-1 is to be programmed when the word organization of the output data is modified, and the fuse element circuit 10-2 is to be programmed when the delay time of the inner circuit is adjusted. In FIG. 12, reference numeral 11 designates a control logic circuit which outputs program data for programming each fuse element circuit.

Operation of the conventional fuse circuit 10 will be described with reference to FIG. 13. In case the fuse element circuit 10-0 is to be programmed in order to adjust the voltage of the internal electrical power source of the semiconductor memory in the manufacturing plant prior to shipping, for example, a special command CMD1 is applied to the external terminal thereof from outside. This special command CMD1 is decoded by a command decoder in the semiconductor memory and the control logic circuit 11 outputs a signal PGM-0 to program the fuse element circuit 10-0 according to the decoded result. In this example, the fuse element circuit 10-1 is not programmed and the semiconductor memory is shipped as a ×8-bit organization product.

After shipping, if a special command CMD2 for programming the fuse element circuit 10-1 is entered accidentally due to an application of a wrong timing signal on the external terminal of the semiconductor memory, the control logic circuit 11 outputs a signal PGM-1 to program the fuse element circuit 10-1 based on the special command CMD2. Accordingly, the fuse element circuit 10-1 is misprogrammed, so that the word organization is modified to the ×4-bit organization from the ×8-bit organization. As a result, this semiconductor memory operates against a user's intention, thus becomes defective as a ×8-bit organization product.

Not only the above-described fuse circuits for modifying a circuit configuration relating to the word organization, but all fuse circuits provided in semiconductor devices such as a fuse circuit for storing defective address data in a redundancy circuit face similar problems concerning misprogramming.

SUMMARY OF THE INVENTION

The present invention has been achieved on the basis of the above findings, and it is an object of the present invention to provide a semiconductor device which can prevent misprogramming of fuse circuits provided therein.

The present invention provides a semiconductor device wherein a circuit configuration is configured in a definable manner, and which has semiconductor device structures including: a first fuse circuit (e.g., elements corresponding to a group of fuse element circuits 911, a fuse element circuit 912, and a fuse element circuit 921 shown in FIGS. 2, and 9 to 11) to store a first data defining the circuit configuration; a second fuse circuit (e.g., elements corresponding to a fuse element circuit 913 and a fuse element circuit 923 shown in FIG. 2, elements corresponding to a fuse element circuit 912 and a fuse element circuit 923 shown in FIG. 9, an element corresponding to a fuse element circuit 950 shown in FIG. 10, and elements corresponding to a fuse element circuit 912 and a fuse element circuit 960 shown in FIG. 11) to store a second data indicating inhibition of programming the first fuse circuit; a program control circuit (e.g., elements corresponding to a control logic circuit 140 shown in FIGS. 2 and 9 to 11) to store the first and second data in the first and second fuse circuits after programming the first and second fuse circuits; and a gate circuit (e.g., elements corresponding to AND gate circuits 914 and 924 shown in FIGS. 2 and 9 to 11) to inhibit the program control circuit from programming the first fuse circuit on condition that the second fuse circuit has been programmed.

According to this structure, once the second fuse circuit is programmed by the program control circuit, the gate circuit inhibits the programming of the first fuse circuit by the program control circuit, so that the data stored in the first fuse circuit will not be rewritten anymore. Thus, even if the program control circuit tries to program the first fuse circuit by mistake, misprogramming thereof can be prevented.

In the above-described semiconductor device, the circuit configuration is, for example, of a redundancy structure to remedy defective addresses, wherein the first fuse circuit includes a plurality of first fuse element circuits (e.g., elements corresponding to a group of fuse element circuits 911 shown in FIG. 9) to store data regarding the defective addresses as the first data, and a second fuse element circuit (e.g., an element corresponding to a fuse element circuit 912 shown in FIG. 9) to store flag data indicating whether the data stored in the plurality of first fuse element circuits are valid or not, and wherein the second fuse circuit is shared with the second fuse element circuit.

In the above-described semiconductor device, the first fuse circuit, for example, includes a plurality of fuse circuits (e.g., elements corresponding to unit blocks 910C, and 920C shown in FIG. 10, and unit blocks 910B and 920C shown in FIG. 11) to store a plurality of data as the first data, and the second fuse circuit (e.g., elements corresponding to a fuse element circuit 950 shown in FIG. 10 and a fuse element circuit 960 shown in FIG. 11) is shared by all or a part of the plurality of fuse circuits.

In the above-described semiconductor device, the first data, for example, stores the defective address data found in the redundancy circuit. The second data includes either one of the data to modify the circuit configuration regarding the word organization of the output data of the semiconductor device of the present invention, the data to modify the circuit configuration regarding the voltage of the internal electrical power source of the semiconductor device of the present invention, or the data to modify the circuit configuration regarding the operating timing of the inner circuit of the semiconductor device of the present invention. In the above-described semiconductor device, the first and second fuse circuits, for example, are configured by using anti-fuses of a destructive type.

Another aspect of the present invention provides a semiconductor device which is provided with a redundancy circuit to remedy defective addresses, and which has a semiconductor device structure including: a first fuse circuit (e.g., elements corresponding to a group of fuse element circuits 911 to store defective addresses, and fuse element circuit 912 to store flag data indicating whether the data stored in the group of fuse element circuits 911 are valid or not, shown in FIG. 2) to store a first data regarding the defective addresses; a second fuse circuit (e.g., a fuse element circuit 921 shown in FIG. 2) to store a second data defining the circuit configuration regarding either one of the word organization, the voltage of the internal electrical power source, and the operating timing of the semiconductor device of the present invention; a third fuse circuit (e.g., elements corresponding to fuse element circuits 913, and 923 shown in FIG. 2) to store a third data indicating inhibition of programming the first fuse circuit; a program control circuit (e.g., an element corresponding to a control logic circuit 140 shown in FIG. 2) to program the first to third fuse circuits and then store the first to third data in the first to third fuse circuits respectively; and a gate circuit (e.g., elements corresponding to AND gate circuits 914 and 924 shown in FIG. 2) to inhibit the program control circuit from programming the first to third fuse circuits on condition that the third fuse circuit has been programmed. The first to third fuse circuits are configured by using anti-fuses of a destructive type.

According to this structure, once the third fuse circuit is programmed by the program control circuit, the gate circuit prohibits the program control circuit from programming the first and the second fuse circuit, so that the data stored in the first and the second fuse circuit will not be rewritten any more. Thus, even if the program control circuit tries to program the first or the second fuse circuit by mistake, misprogramming thereof can be prevented.

According to the present invention, when the fuse circuit for inhibiting programming is programmed, the program control circuit is prohibited from programming the fuse circuit for circuit configuration, so that misprogramming of the fuse circuits can be prevented.

DETAILED DESCRIPTION OF THE INVENTION

The preferred embodiments of the present invention will be explained below with reference to the accompanying drawings.

First Embodiment

Figure 1:
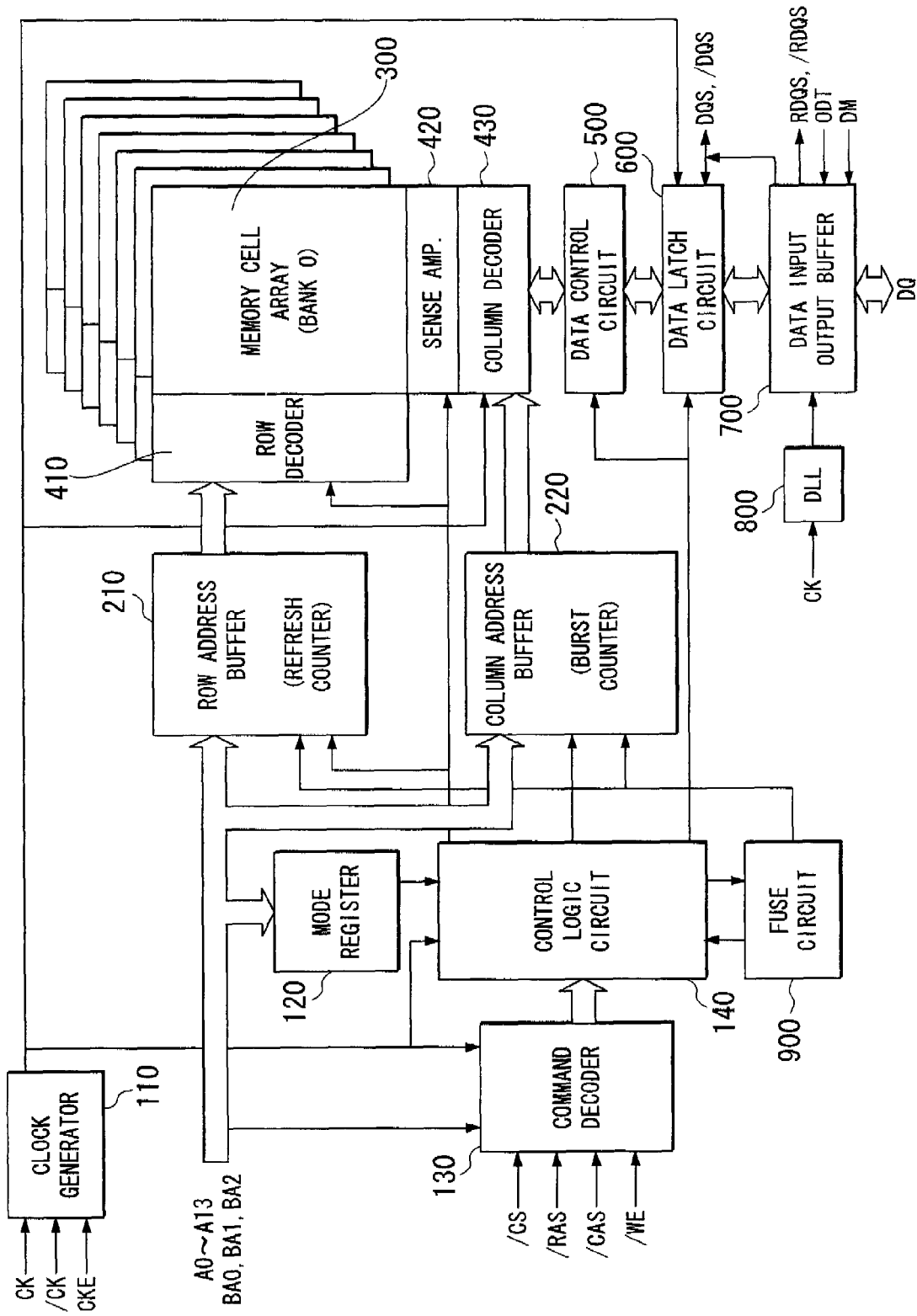
FIG. 1 is a block diagram of the semiconductor device according to the first embodiment of the present invention.

The general structure of a semiconductor device according to a first embodiment of the present invention is shown in FIG. 1. This semiconductor device is a Synchronous Dynamic Random Access Memory (Synchronous DRAM) which is a type of semiconductor memories, and is a semiconductor device wherein the circuit configurations are definable. In FIG. 1, the semiconductor device may include a clock generator 110, a mode register 120, a command decoder 130, a control logic circuit 140, a row address buffer 210, a column address buffer 220, a memory cell array 300, a row decoder 410, a sense amplifier 420, a column decoder 430, a data control circuit 500, a data latch circuit 600, a data input output buffer 700, a delayed locked loop (DLL) 800, and a fuse-circuit 900.

In this embodiment, a clock generator 110 is configured to generate internal clock signals after receiving clock signals CK, /CK and a clock enable signal CKE which are input externally. The internal clock signal is distributed to the command decoder 130, the control logic circuit 140, the column decoder 430, and the data latch circuit 600. The internal clock signal is used as a standard of the operating timing of each circuit.

The mode register 120 is configured to store various operation parameters such as burst length, latency and the like. The operation parameters are entered from the outside by making use of the address signals A0 to A13.

The command decoder 130 is configured to decode the operation commands such as a read command, a write command and the like. The operation commands are entered from outside by using a chip select signal /CS, a row address strobe signal /RAS, a column address strobe signal /CAS, and a write enable signal /WE.

The control logic 140 is configured to generate various signals to execute operation command decoded by the command decoder 130.

The row address buffer 210 is configured to load, from among the address signals A0 to A13 and the bank address signals BA0, BA1, and BA2 inputted from outside, the row address signals to select a row in a memory cell array 300. This row address buffer 210 is provided with a refresh counter for stepping the row address in a refresh operation.

The column address buffer 220 is configured to load, from among the address signals A0 to A13 and the bank address signals BA0, BA1, and BA2 inputted from outside, the column address signals to select a column in the memory cell array 300. This column address buffer 220 is provided with a burst counter for counting the burst length.

The memory cell array 300 is configured by a matrix array of the memory cells in a matrix form. A plurality of word lines extends in its row direction. A plurality of bit lines extends in its column direction. The memory cells are located at the crossing points of the word lines and the bit lines. Only one cell is selected for each memory cell by selecting a word line and a bit line.

The row decoder 410 is configured to select only one word line from the memory cell array 300 based on the row address signal outputted from the row address buffer 210.

The sense amplifier 420 is configured to amplify weak data signals from the memory cell appeared on the bit line of the memory cell array 300.

The column decoder 430 is configured to select a bit line from the memory cell array 300. In this embodiment, the memory cell array 300, the row decoder 410, and the sense amplifier 420 are provided for each of the plurality of banks, and each bank is selected by the bank address signals BA0, BA1, and BA2.

The data control circuit 500 is configured to control the output order of the data readout from the memory cell array 300 in a burst mode.

The data latch circuit 600 is configured to store the input and output data temporarily.

The data input output buffer 700 is configured to supply data DQ to the external terminal and to receive data DQ from the external terminal.

The delayed locked loop (DLL) 800 is configured to delay the external clock signals CK and /CK, thereby generating the internal clock signals to decide operating timing of the data input output buffer 700.

The fuse-circuit 900 is configured to store data that is to define various circuit configurations such as data for defining a circuit configuration relating to the redundancy structure to remedy defects, data for defining a circuit configuration relating to the word organization of the output data, data for defining a circuit configuration relating to the voltage of the internal electrical power source, and data for defining a circuit configuration relating to the operating timing of the inner circuit.

Figure 2:
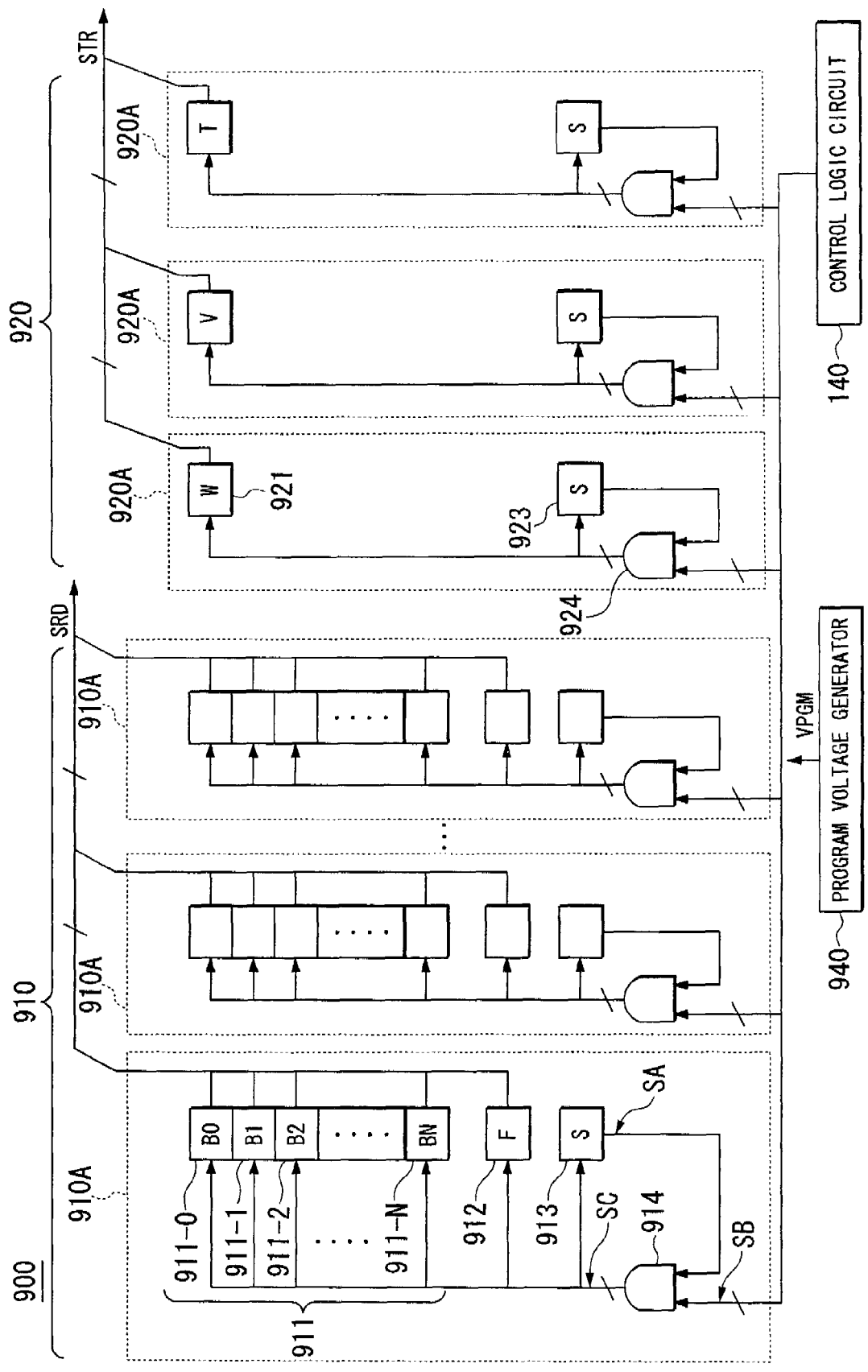
FIG. 2 is a block diagram of the fuse circuit provided in the semiconductor device according to the first embodiment of the present invention.

The configuration of the fuse circuit 900 will be described in detail with reference to FIG. 2. As shown in FIG. 2, the fuse circuit 900 is structured with a fuse block 910 which is used when the circuit configuration relating to the redundancy structure is defined, and with a fuse block 920 which is used when the circuit configuration relating to the word organization, the voltage of the internal electrical power source, the operating timing of the inner circuit or the like is defined. Moreover, the fuse circuit 900 is structured with anti-fuses as fuse elements as described later. Program signals to control programs of the fuse circuit 900 are generated at the above-described control logic circuit 140 shown in FIG. 1. A program voltage generator 940 is configured to generate a certain program voltage which will be applied when the fuse circuit 900 is programmed.

In this embodiment, the fuse block 910 is configured with a plurality of unit blocks 910A. Each unit block 910A includes fuse element circuits 911-0, 911-1, 911-2, ..., 911-N, 912, 913 and an AND gate circuit 914. Among these, a group of fuse element circuits 911 including the fuse element circuits 911-0, 911-1, 911-2, ..., and 911-N is configured to store bit data B0, B1, B2, ..., and BN (N is natural number) of a defective address. The fuse element circuit 912 is configured to store a flag data F indicating whether the data stored in the group of fuse element circuits 911 are valid or not. The defective addresses stored in the group of fuse element circuits 911 and the flag data F stored in the fuse element circuit 912 forms a data defining the circuit configuration relating to the redundancy structure.

The fuse element circuit 913 is configured to store a data S which expresses inhibition of programming of the group of fuse element circuits 911 and the fuse element circuit 912. The AND gate circuit 914 is configured to prohibit the control logic circuit 140 from programming the unit block 910A under the condition that the fuse element circuit 913 has been programmed and the data S has been stored in the fuse element circuit 913.

Although FIG. 2 is drawn schematically, the control logic circuit 140 is configured to output program signals SB for individually programming N+3 fuse element circuits in total, that is, N+1 fuse element circuits including the group of fuse element circuits 911, one fuse element circuit 912, and one fuse element circuit 913. Moreover, the AND gate circuit 914 is configured so as to operate multiplication of the program signal SB outputted from the control logic circuit 140 and the value of binary signal SA outputted from the fuse element circuit 913, and then apply the program signal obtained as the multiplication result on the group of fuse element circuits 911, the fuse element circuit 912, and the fuse element circuit 913 respectively.

The fuse block 920, which is used when the circuit configuration relating to the word organization and the like of the output data is defined, includes a plurality of unit blocks 920A. In this embodiment, the first unit bock 920A includes a fuse element circuit 921 to store a bit data W which defines the circuit configuration relating to the word organization, a fuse element circuit 923 to store program inhibition data which expresses inhibition of programming the fuse element circuit 921, and an AND gate circuit 924 to inhibit programming the fuse element circuit 921 on condition that a program inhibition data has been programmed and/or stored in the fuse element circuit 923. While other fuse element circuits 920A are configured similarly, in this embodiment, a data V which defines the circuit configuration relating to the voltage of the internal electrical power source is stored in the second fuse element circuit 920A, and a data T which defines the circuit configuration relating to the operating timing of the inner circuit is stored in the third fuse element circuit 920A.

Although FIG. 2 is drawn schematically, the control logic circuit 140 is structured to output program signals for programming the fuse element circuits 921 and 923 individually, and the AND gate circuit 924 is configured so as to operate multiplication of the program signal outputted from the control logic circuit 140 and the value of a binary signal outputted from the fuse member 923, and then apply the program signal obtained as the multiplication result on the fuse element circuits 921 and 923.

Figure 3B:
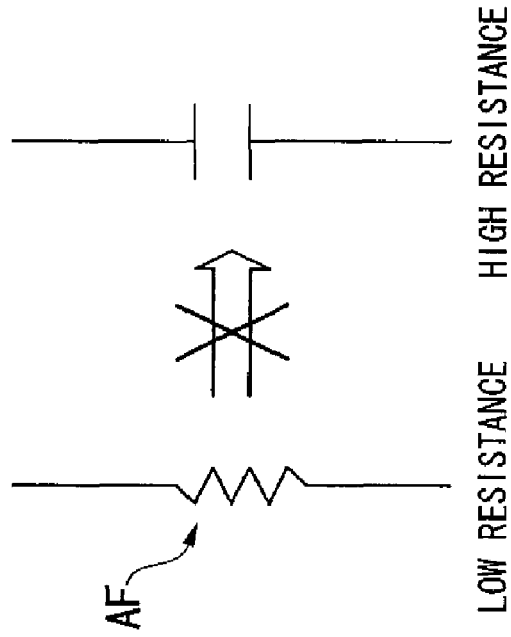
FIGS. 3A and 3B are explanatory drawings to explain the programming process of the fuse circuits according to the first embodiment of the present invention.
Figure 3A:
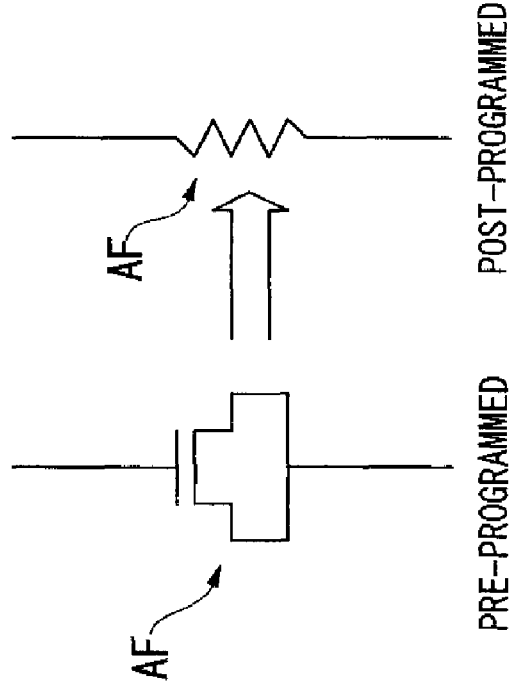

Next, the aforementioned fuse element circuits will be described in more detail with reference to FIGS. 3 and 4. The aforementioned fuse element circuits are mainly configured with anti-fuses AF of a destructive type comprising MOS transistor. If a gate oxide film thereof is unbroken and the anti-fuse is not blown, then this state corresponds to a pre-programmed state (see FIG. 3A). In this pre-programmed state, the connection between a gate and source/drain is in the electrically open state, and the anti-fuse AF is in the high resistance state. If the gate oxide film is broken down and the anti-fuse is blown, then this corresponds to a post-programmed state (see FIG. 3B). In this post-programmed state, the connection between the gate and the source/drain is in the form of electrical short-circuit, and the anti-fuse AF is in the low resistance state.

Programming operation of the anti-fuse AF is performed by applying a predetermined program voltage to the circuit between the gate and the source drain of the MOS transistor, thereby breaking down the gate oxide film thereof. According to this anti-fuse AF, when the gate oxide film is broken down and thus the connection between the gate and source/drain form a short-circuit, the connection between the gate and the source/drain will never recover to the open state, so that the data written in the anti-fuse AF will never be lost.

That is, since such anti-fuses of a destructive type can be programmed only once, they are also called one-time type. When the anti-fuse is of this type, only a measure to prevent an unprogrammed anti-fuse from being programmed after the shipment of the product to customers is required to be provided, but not a measure to prevent data loss of already-programmed anti-fuse. In the present embodiment, once the fuse element circuits 913 and 923, in which the data indicating program inhibition are stored, are programmed, the data will never be lost thereafter, so that misprogramming the group of fuse element circuits 911, for example, including the pre-programmed anti-fuse can be prevented effectively.

Figure 4A:
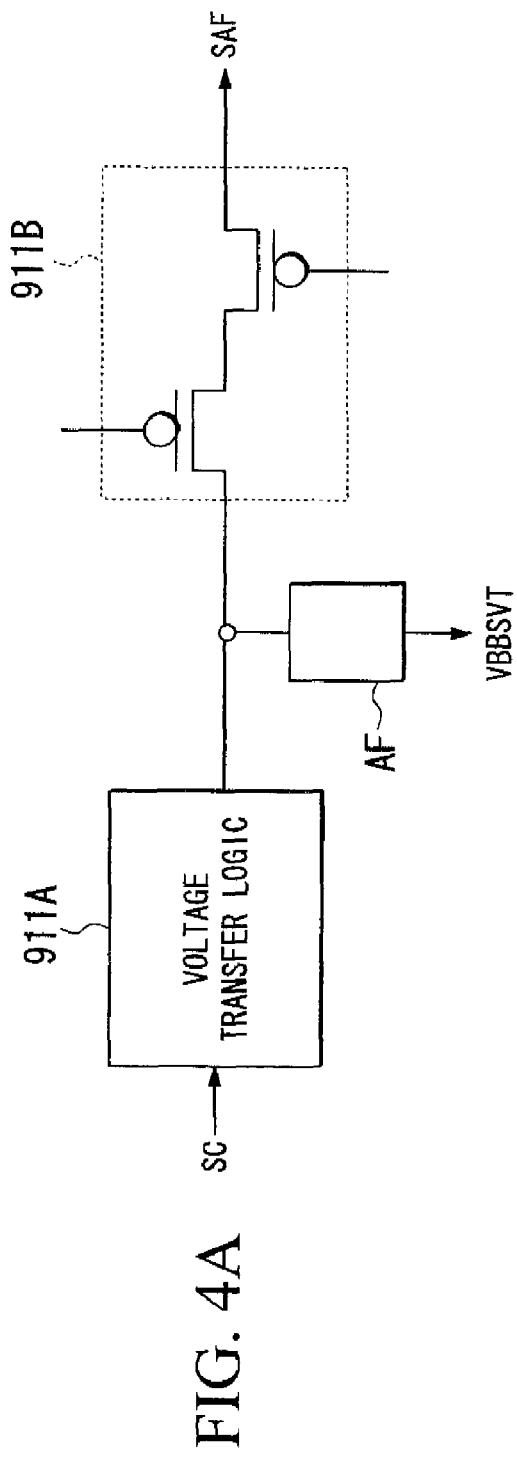
FIGS. 4A and 4B are block diagrams of the fuse element circuit provided in the fuse circuit according to the first embodiment of the present invention.

FIG. 4A illustrates a configuration of the fuse element circuit 911-0. Except for the fuse element circuits 913 and 923, all the other fuse element circuits have the same configuration as that of the fuse element circuit 911-0. As shown in FIG. 4A, the fuse element circuit 911-0 includes a voltage transfer logic 911A, an anti-fuse AF, and a selection circuit 911B. The voltage transfer logic 911A is configured to apply predetermined program voltage VPPSVT (6V for example) to one end of the anti-fuse AF responding to a program signal SC upon programming. To the other end of the anti-fuse AF, a predetermined negative voltage VBBSVT (−2V for example) is applied upon programming. The selection circuit 911B is configured to select the anti-fuse AF when the data stored in the anti-fuse AF is readout.

According to the configuration of this fuse element circuit 911-0, a low level signal is outputted as a signal SAF in the pre-programmed state, and a high level signal is outputted as the signal SAF in the post-programmed state. Accordingly, by selectively programming the fuse element circuits 911-0, 911-1, 911-2, . . . , and 911-N, each bit data of a defective address can be written in the group of fuse element circuits 911.

Figure 4B:
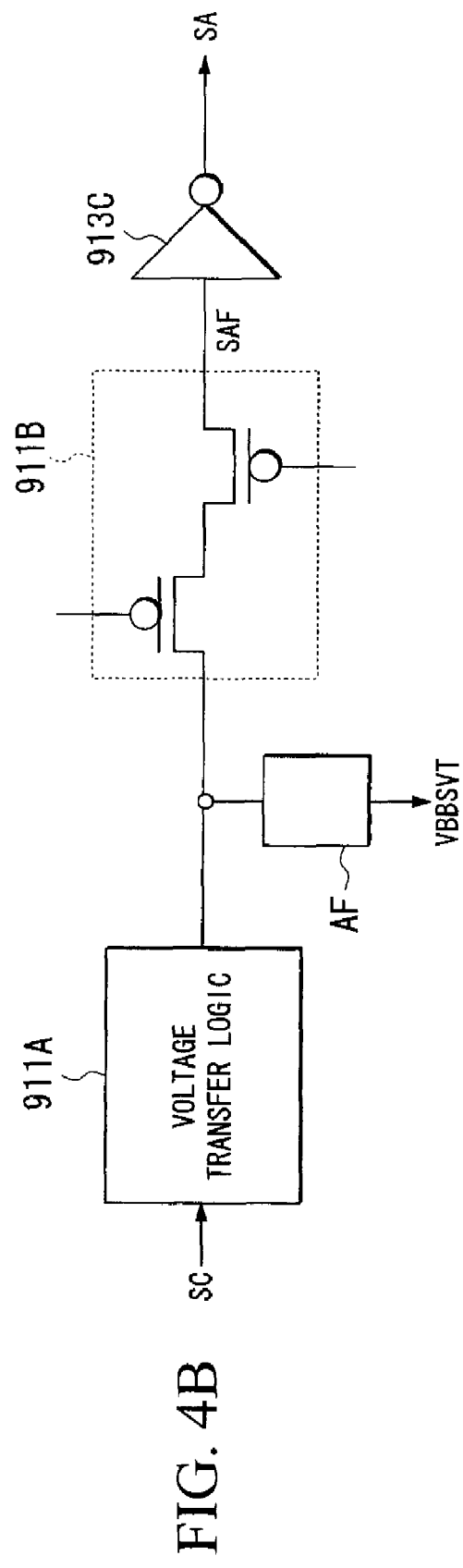

FIG. 4B illustrates a configuration of the fuse element circuit 913. As shown in FIG. 4B, the fuse element circuit 913 is provided with an inverter 913C in the output part in addition to the configuration of the above-described fuse element circuit 911-0, and is configured such that the signal SAF is reversed by the inverter 913C to be consequently outputted as a signal SA. According to the configuration of this fuse element circuit 913, a high level signal is outputted as the signal SA in the pre-programmed state, and a low level signal is outputted as the signal SA in the post-programmed state.

Figure 5:
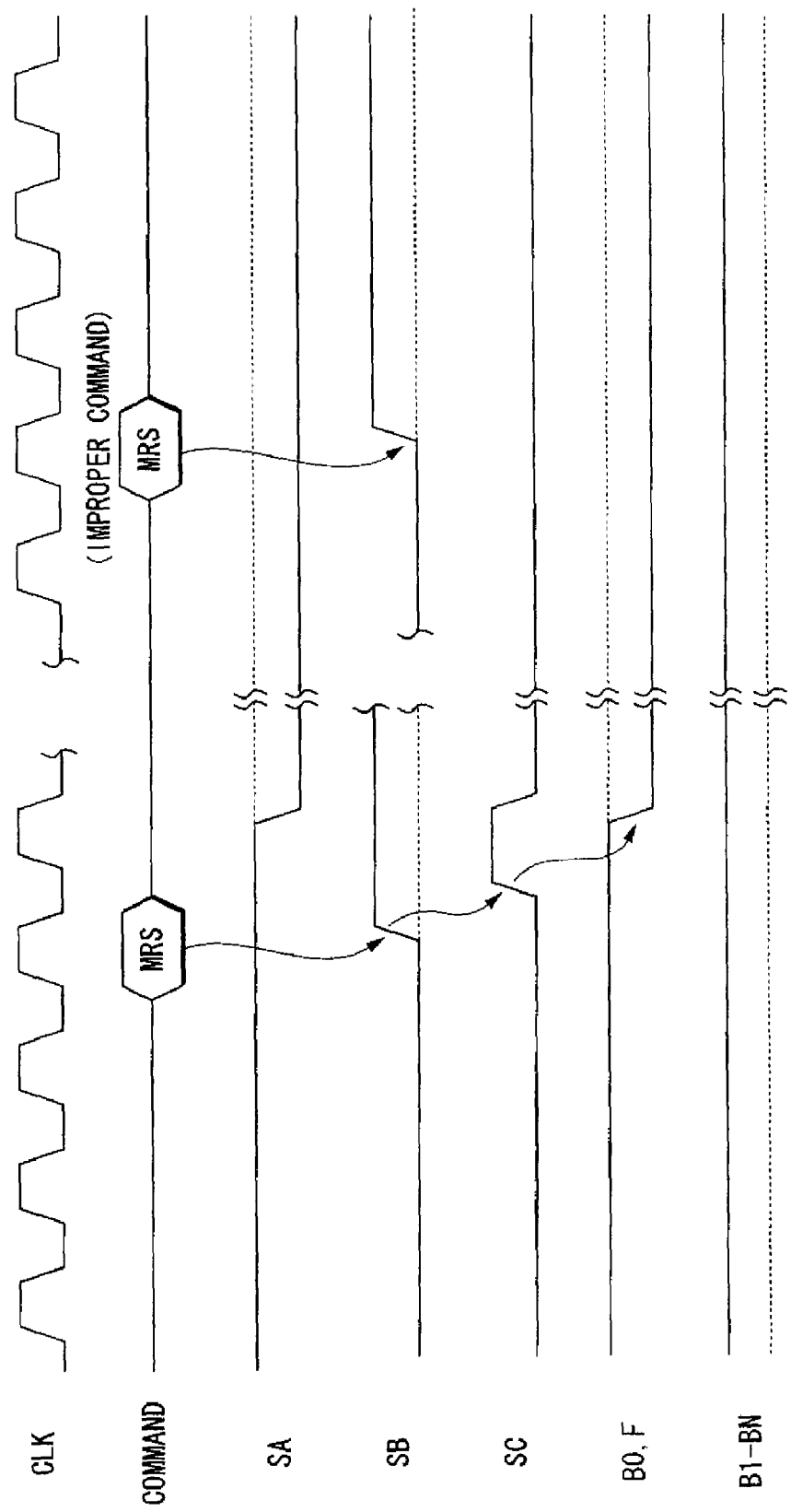
FIG. 5 is a timing chart to explain the operation of the semiconductor device according to the first embodiment of the present invention.

Next, the operation of the semiconductor device of the present invention will be described with reference to a timing chart shown in FIG. 5 in a case where a redundancy structure is defined in the fuse circuit in order to remedy defects as an example. First of all, when the assembly process of the semiconductor device package is completed, a final screening test is operated. When a defective cell is detected by a memory tester in the final screening test, the address of the defective cell (i.e., a defective address) is stored in the memory tester. Then, the memory tester provides a special command for defect remedy (e.g., a Mode Register Set command (MARS command) unique to a manufacturer such as the address signal set as A7=1) to the semiconductor memory.

The special command MRS is decoded by the command decoder shown in FIG. 1, and based on the decoded result, the control logic 140 provides a control signal necessary for defining the redundancy structure to the fuse circuit 900. When the control signal is provided to the fuse circuit 900, the control logic circuit 140 outputs the program signals SB for programming the group of fuse element circuits 911 and the fuse element circuits 912 and 913, thereby programming the group of fuse element circuits 911 and the fuse element circuits 912 and 913 and then storing the defective address data, the flag data F, and the program inhibition data S respectively.

In a default state before the fuse element circuit 913 is programmed, since the signal SA outputted from the fuse element circuit 913 is of a high level, when the program signal SB is outputted from the control logic circuit 140, the AND gate circuit 914 passes through the program signal SB, and then provides them to the group of fuse element circuits 911 and the fuse element circuits 912 and 913 as the program signal SC. That is, when the command MRS is entered in a state in which the fuse element circuit 913 is not programmed, the group of fuse element circuits 911 and the fuse element circuits 912 and 913 are programmed.

At this time, if the signal SA becomes the low level as the program of the fuse element circuit 913 proceeds, the output signal SC of the AND gate circuit 914 to which the signal SA is inputted is fixed to the low level, so that programs of each fuse element circuit in the unit block circuit 910A will end in an incomplete state. Therefore, the AND gate circuit 914 forcibly maintains the program signal SA at the high level for a certain period of time from when the program signal SB is outputted from the control logic circuit 140 till all the fuse element circuits in the unit block circuit 910A are programmed completely.

Consequently, each bit data of the defective address and the flag data F are stored in the group of fuse element circuits 911 and in the fuse element circuit 912, respectively, and the program inhibition data S is stored in the fuse element circuit 913. In the example shown in FIG. 5, when the fuse element circuit 913 is programmed, the signal SA outputted from them becomes the low level, and the bit data B0 of the defective address and the flag data F also becomes the low level, while the bit data B1 to BN are maintained at the high level (the initial values).

Next, the operation in a case in which the control logic circuit 140 outputs the program signal SB improperly due to the special command MRS entered improperly because an improper signal is impressed to the semiconductor device after the completion of the above-described program will be described with reference to FIG. 5. In this case, since a low level signal SA from the fuse element circuit 913 is applied to one input of the AND gate circuit 914, even if a program signal SB from the control logic circuit 140 is applied to the other input part, the program signal SC outputted from the AND gate circuit 914 is maintained in a condition fixed at the low level. That is, the program signal SB outputted from the control logic circuit 140 is nullified.

As a result, programming of the unit block 910A (the group of fuse element circuits 911 and the fuse element circuits 912 and 913) is inhibited, thereby preventing misprogramming based on an improper special command MRS, so that the following defective remedy operations are properly carried out. In the present embodiment, since an anti-fuse AF of destructive type is used, the data of the fuse element circuit 913 programmed once will never change. Thus, the signal SA is fixed stably at the low level, thereby preventing misprogramming thereafter in a stable manner.

While the operation of the fuse element circuit 900 has been described above exemplifying the case in which the redundancy structure is defined, the operation in a case in which the word organization is defined can also be described similarly. That is, when the word organization is defined, the fuse element circuits 921 and 923, which compose the unit block 920A of the fuse block 920 shown in FIG. 2, are programmed. Then, an output signal of the fuse element circuit 923, which corresponds to the above-described fuse element circuit 913, is fixed to a low level, so that the output signal of the AND gate circuit 924 to which the output signal is inputted is fixed to a low level regardless of the program signal sent from the control logic circuit 140, thereby preventing misprogramming of the unit block 920A.

Next, an example of a test process of a case in which the modification of the word organization is carried out by the semiconductor device of the present invention will be described with reference to FIG. 6. Now, in the fuse circuit 900 shown in FIG. 2, it is assumed that among the plurality of unit blocks composing the fuse blocks 910 and 920, only one unit block 920A for storing the data W for modifying the word organization exists, and that the plurality of unit blocks 910A for a defect remedy, the unit block 920A for storing the data V for adjusting the voltage of the internal electrical power source, and the unit block 920A for storing the data T for adjusting the operating timing do not exist. Moreover, in the initial state in which the fuse circuit 900 has not been programmed, the word organization is to be set to ×8-bit organization.

First of all, a wafer test of a wafer, on which a semiconductor device provided with the above-described fuse circuit 900 including only one unit block 920A for modifying the word organization is formed, is carried out (step S1). Then, an assembly process to mount the semiconductor device on a package is operated (step S2) and a final screening test is carried out (step S3). After that when the word organization is modified according to the demand of customers (step S4; YES), a program is run on the fuse element circuit 921 of the unit block 920A for modifying the word organization to modify the word organization to ×4-bit organization (step S5), and then the fuse element circuit 923 is programmed and the data S for program inhibition is stored therein (step S6). As a result, a product with the word organization of ×4-bit organization can be obtained.

On the other hand, when the word organization is not modified in the above-described step S4 (step S4; NO), the fuse element circuit 921 is not programmed but the fuse element circuit 923 for program inhibition is programmed and the program inhibition data S is stored therein (step S7). As a result, a product with the word organization of ×8-bit organization can be obtained. According to the semiconductor device of the present invention, it is necessary to perform the final screening test only once.

In this flow chart, the above-described step S6 may be omitted because it is very rare that the already-programmed fuse element circuit 921 is restored to a high resistance state (pre-destruction state) from a low resistance state (post-destruction state), and the data will not be written over as a matter of fact. That is, even in the case in which the fuse element circuit 923 is not programmed, the data is unchanged even if the fuse element circuit 921 is misprogrammed by a customer after the shipment of the product, since the fuse element circuit 921 has already been programmed. Moreover, the fuse element circuit 923 is used in order to prevent misprogramming, so that even if a customer misprograms it after the shipment of the product, the word organization is not modified by the misprogramming, and will not have an effect on the functions of the product.

Figure 7:
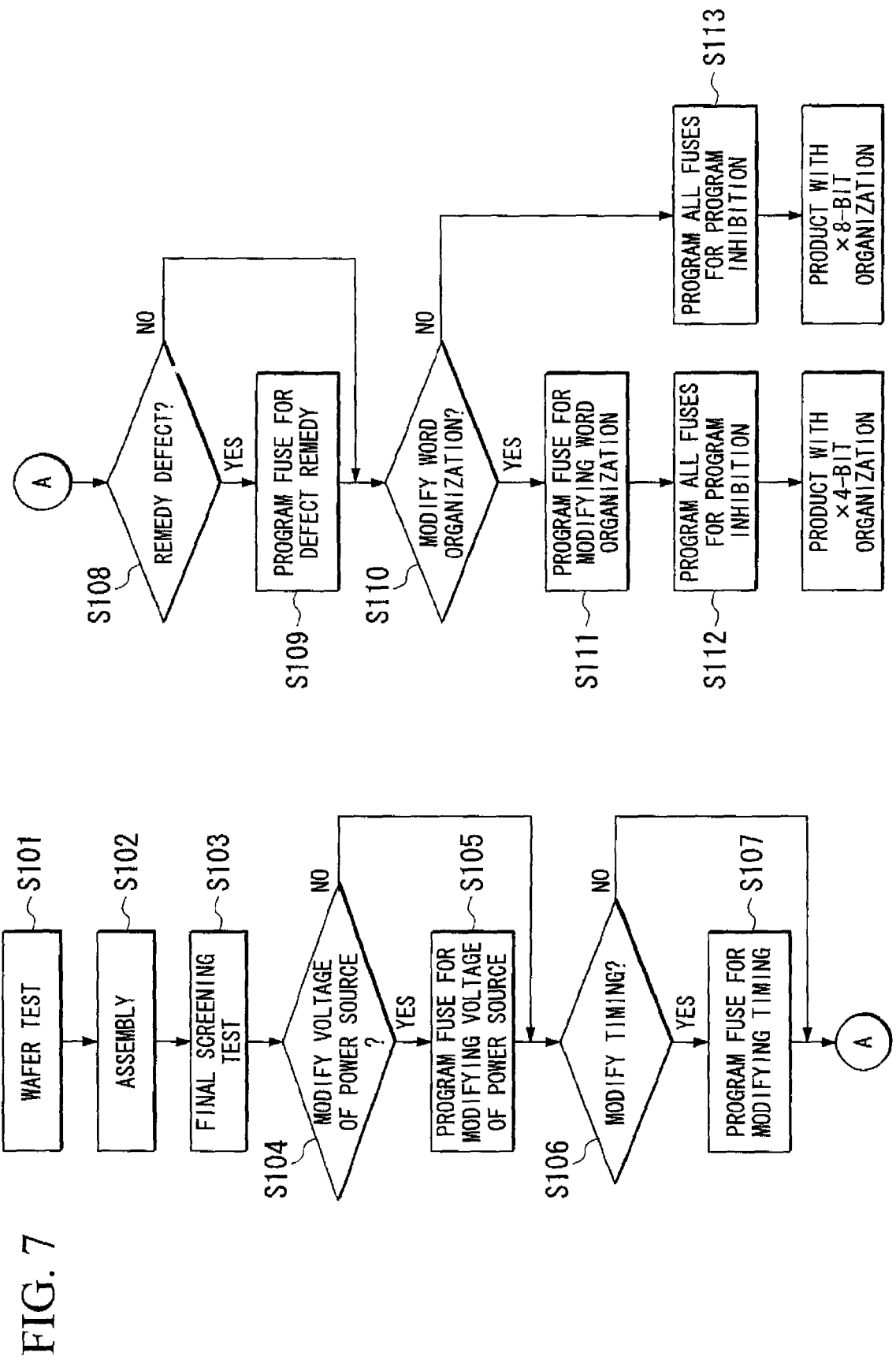
FIG. 7 is a flow chart to explain one example of a test process of the semiconductor device (in the case of using a redundancy circuit or the like) according to the first embodiment of the present invention.

Next, an example of a test process of the semiconductor device of the present invention will be described with reference to FIG. 7 with a case in which the fuse circuit 900 comprises all of the unit block 910A for defect remedy to remedy the defective bit in the redundant memory, the unit block 920A for modifying the word organization, the unit block 920A for adjusting the voltage of the internal electrical power source, and the unit block 920A for adjusting the operating timing as shown in FIG. 2.

Figure 6:
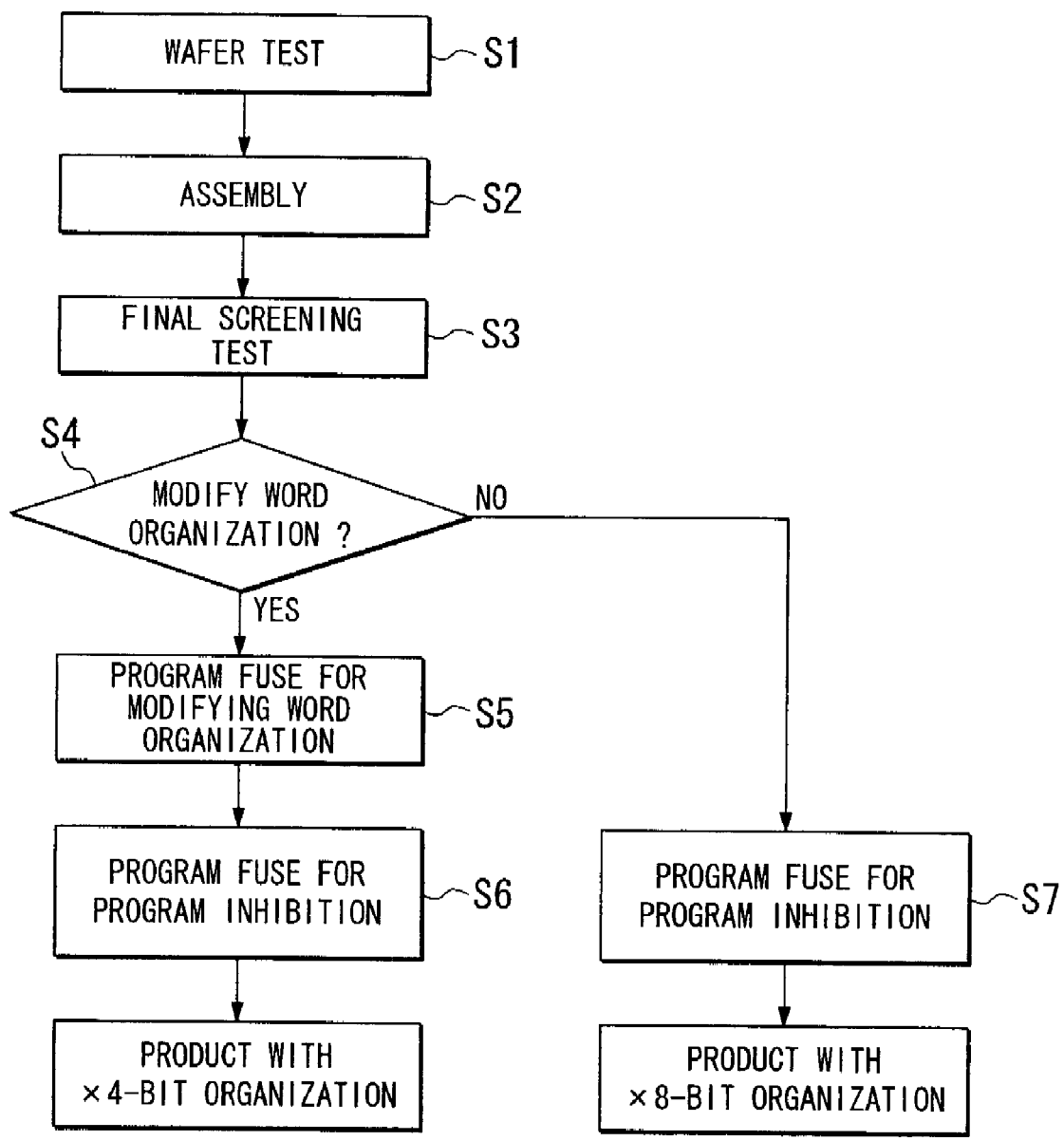
FIG. 6 is a flow chart to explain one example of a test process of the semiconductor device (in the case of modifying the word organization) according to the first embodiment of the present invention.

In this case, in the same manner as the above-described steps S1 to S3 shown in FIG. 6, a wafer test is carried out (step S1), an assembly process is operated (step S2), and then a final screening test is carried out (step S3). After that, it is judged whether the voltage of the internal electrical power source needs to be adjusted or not based on the results of the aforementioned final screening test (step S104). When the voltage of the internal electrical power source needs to be adjusted (step S104; YES), the fuse unit 920A for adjusting the voltage of the internal electrical power source is programmed (step S105). When the adjustment of the voltage is not necessary (step S104; NO), the aforementioned step S105 is skipped and the process jumps to the next step.

Next, it is judged whether the operating timing of the inner circuits needs to be adjusted or not based on the result of the aforementioned final screening test (step S106). When the operating timing needs to be adjusted (step S106; YES), the fuse unit 920A for adjusting the operating timing is programmed (step S107). If the adjustment of the operating timing is not necessary (step S106; NO), the aforementioned step S107 is skipped and the process jumps to the next step.

Then, it is judged whether the defect caused by defective memory cells needs to be remedied or not based on the aforementioned final screening test (step S808). When the defect needs to be remedied (step S108; YES), the fuse unit 910A for defect remedy is programmed (step S109). If the remedy of the defect is not necessary (step S108; NO), the aforementioned step S109 is skipped and the process jumps to the next step.

Next, it is judged whether the word organization needs to be modified or not (step S110). When the word organization needs to be modified (step S110; YES), the fuse unit 910A for modifying the word organization is programmed (step S111). Then, all the fuse units 913 and 923 for program inhibition are programmed (step S112). Consequently, a non-defective product with ×4-bit organization, in which the voltage of the internal electrical power source and the operating timing were adjusted and the defect was remedied based on the results of the final screening test, can be obtained.

On the other hand, if the modification of the word organization is not necessary in the aforementioned step S110 (step S110; NO), the aforementioned step S111 is skipped, and all the fuse units 913 and 923 for program inhibition are programmed (step S113). Consequently, based on the results of the final screening test, the voltage of the internal electrical power source and the operating timing are adjusted and the defect is remedied. Accordingly, a product intended to have an improved yield rate can be obtained due to modification of the word organization, optimization of the voltage of the internal electrical power source and of the operating timing, and remedy of a defective memory.

Figure 8:
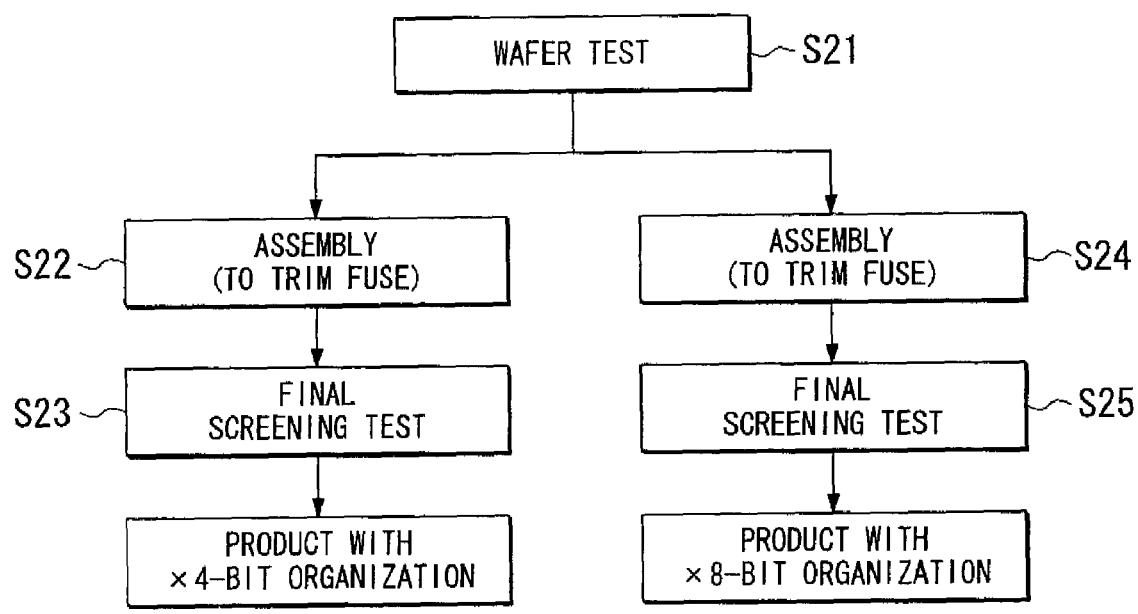
FIG. 8 is a flow chart to explain a test process by a conventional device (in the first embodiment of the present invention).

Just for reference, a test process of a conventional device, which is structured so that the word organization is switched by a laser fuse or a bonding option, will be described with reference to FIG. 8. First of all, a wafer test is carried out (step S21). For the devices judged as ones having defective bits in the output data as a result of the wafer test, the word organization is switched to ×4-bit organization by a laser fuse or a bonding option in an assembly process (step S22). Then, a final screening test as a product with ×4-bit organization is carried out (step S23), and if the test is passed, a product with ×4-bit organization can be obtained.

On the other hand, for those devices in which no defective bit is detected in the wafer test, the word organization is switched to ×8-bit organization by a laser fuse or a bonding option in the assembly process (step S24). Then, a final screening test as a product with ×8-bit organization is carried out (step S25), and if the test is passed, a product with ×8-bit organization can be obtained. Thus, according to the conventional devices, a final screening test according to respective word organization should be carried out, thereby making the test process complicated.

Second Embodiment

Figure 9:
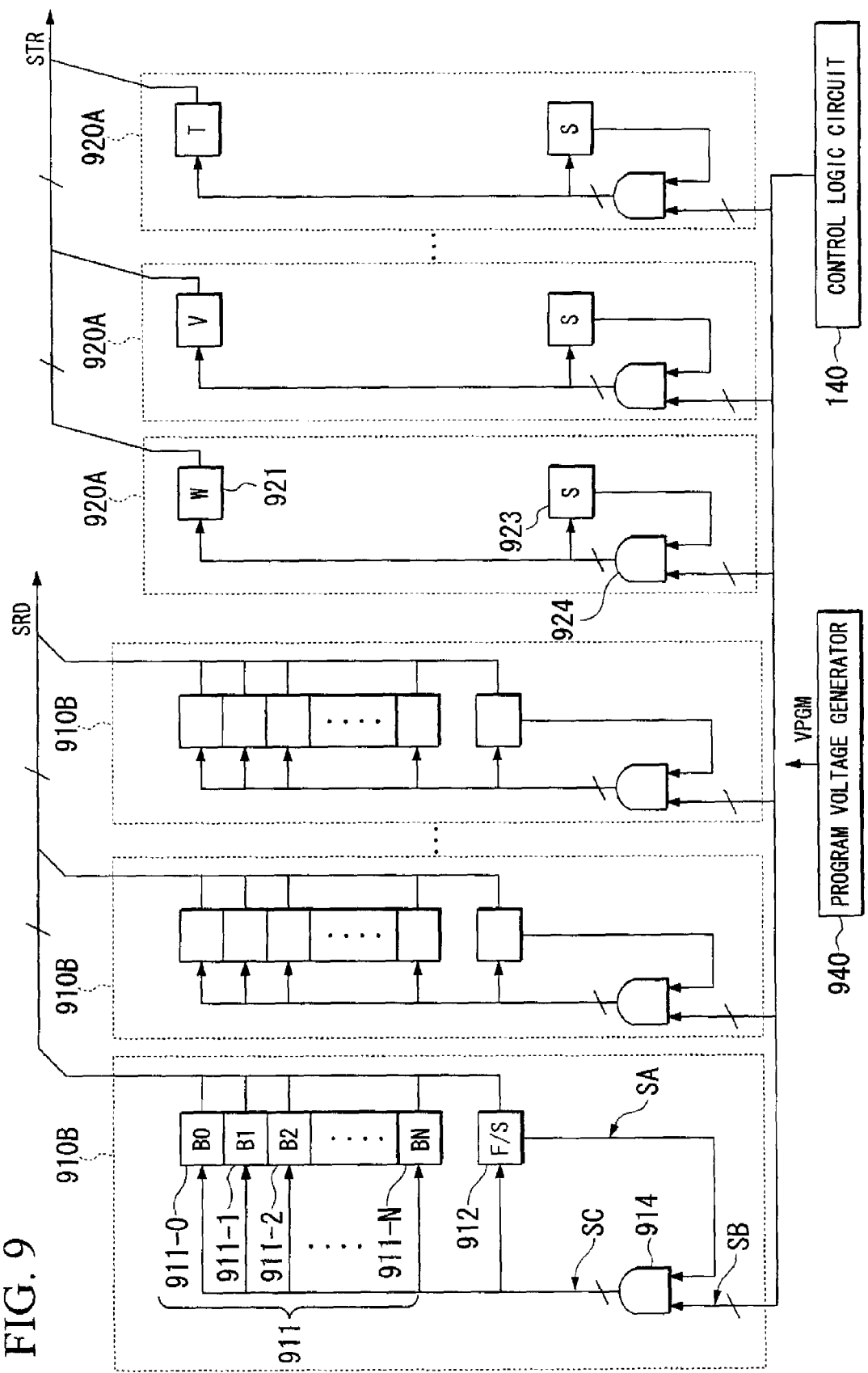
FIG. 9 is a block diagram of the fuse circuit provided in the semiconductor device according to the second embodiment of the present invention.

A second embodiment of the present invention will be described with reference to FIG. 9. The difference between the above-described first embodiment and the second embodiment is that in the fuse circuit 900 shown in FIG. 2, the fuse element circuit 913 for storing the program inhibition data is shared with or used as the fuse element circuit 912 for storing the flag data F in the second embodiment. That is, in the present second embodiment, the fuse element circuit 913 is omitted, and the output signal SA is derived from the fuse element circuit 912. The rest of the structure is the same as that of the first embodiment. By making the fuse element circuit 912 function as the fuse element circuit 913 in this way, the configuration of the fuse circuit can be simplified.

Third Embodiment

Figure 10:
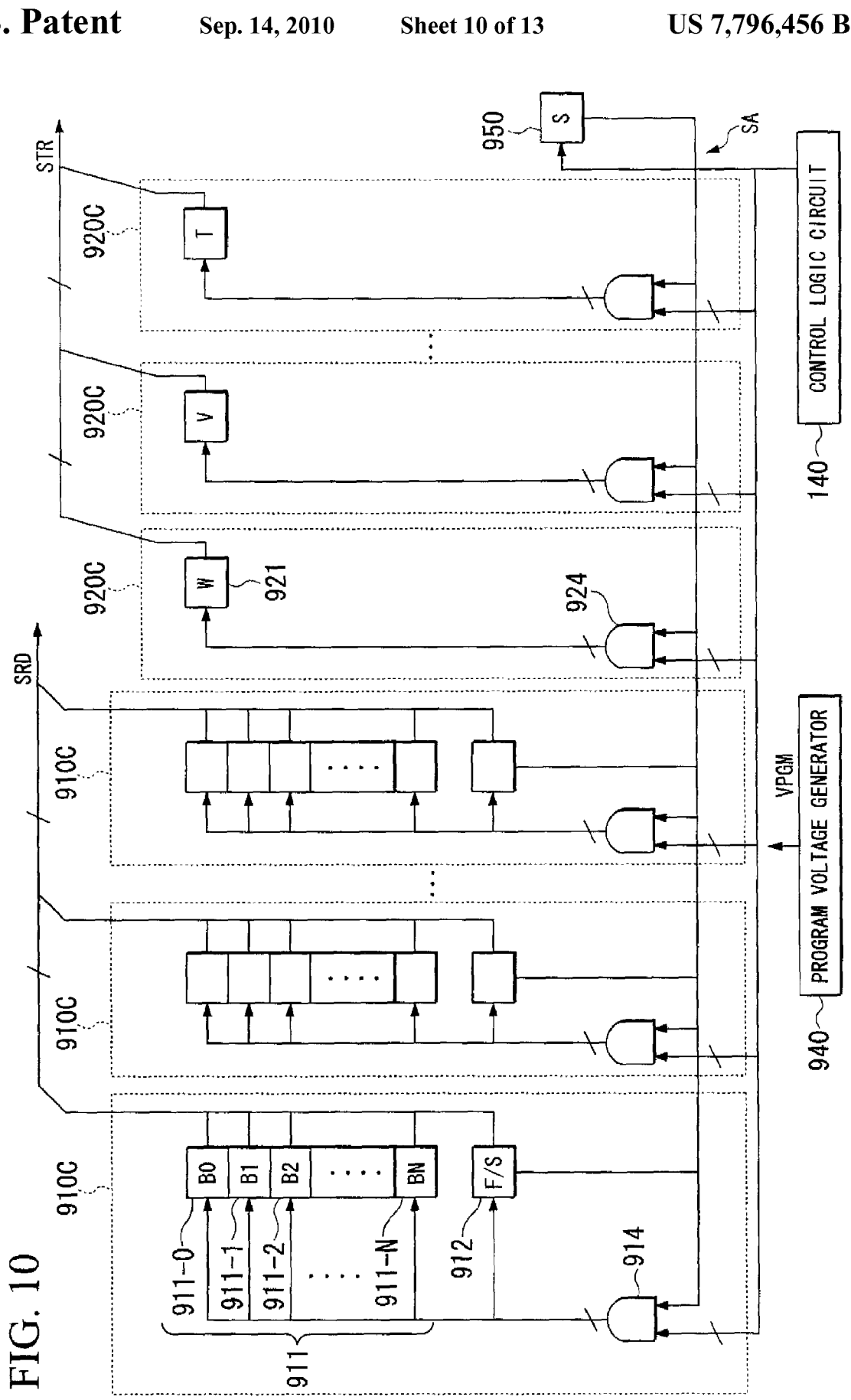
FIG. 10 is a block diagram of the fuse circuit provided in the semiconductor device according to the third embodiment of the present invention.

A third embodiment of the present invention will be described with reference to FIG. 10. The difference between the above-described first embodiment and the present third embodiment is that in the fuse circuit 900 shown in FIG. 2, instead of the fuse element circuits 914 and 924 provided in the plurality of fuse blocks 910 and 920 for storing a plurality of data for defining the plurality of circuit configurations, only one fuse element circuit 950 is provided in the third embodiment, and by deriving the signal SA from the fuse element circuit 950, the plurality of fuse blocks 910 and 920 share this one fuse element circuit 950 in the third embodiment. The rest of the structure is the same as that of the first embodiment. By sharing only the one fuse element circuit 950 by the plurality of fuse blocks 910 and 920 in this way, the configuration of the fuse circuits can be further simplified.

Fourth Embodiment

Figure 11:
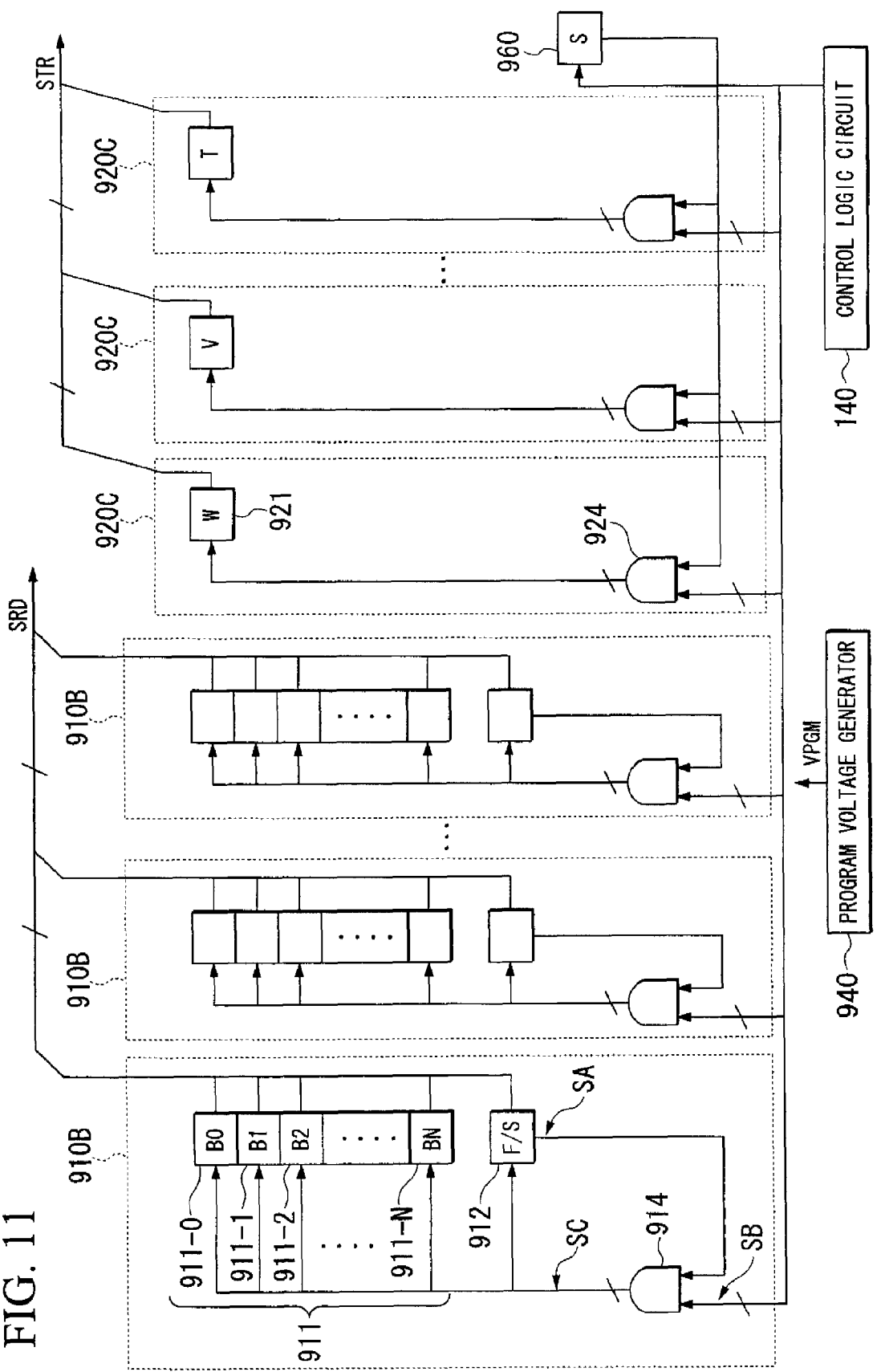
FIG. 11 is a block diagram of the fuse circuit provided in the semiconductor device according to the fourth embodiment of the present invention.
Figure 12:
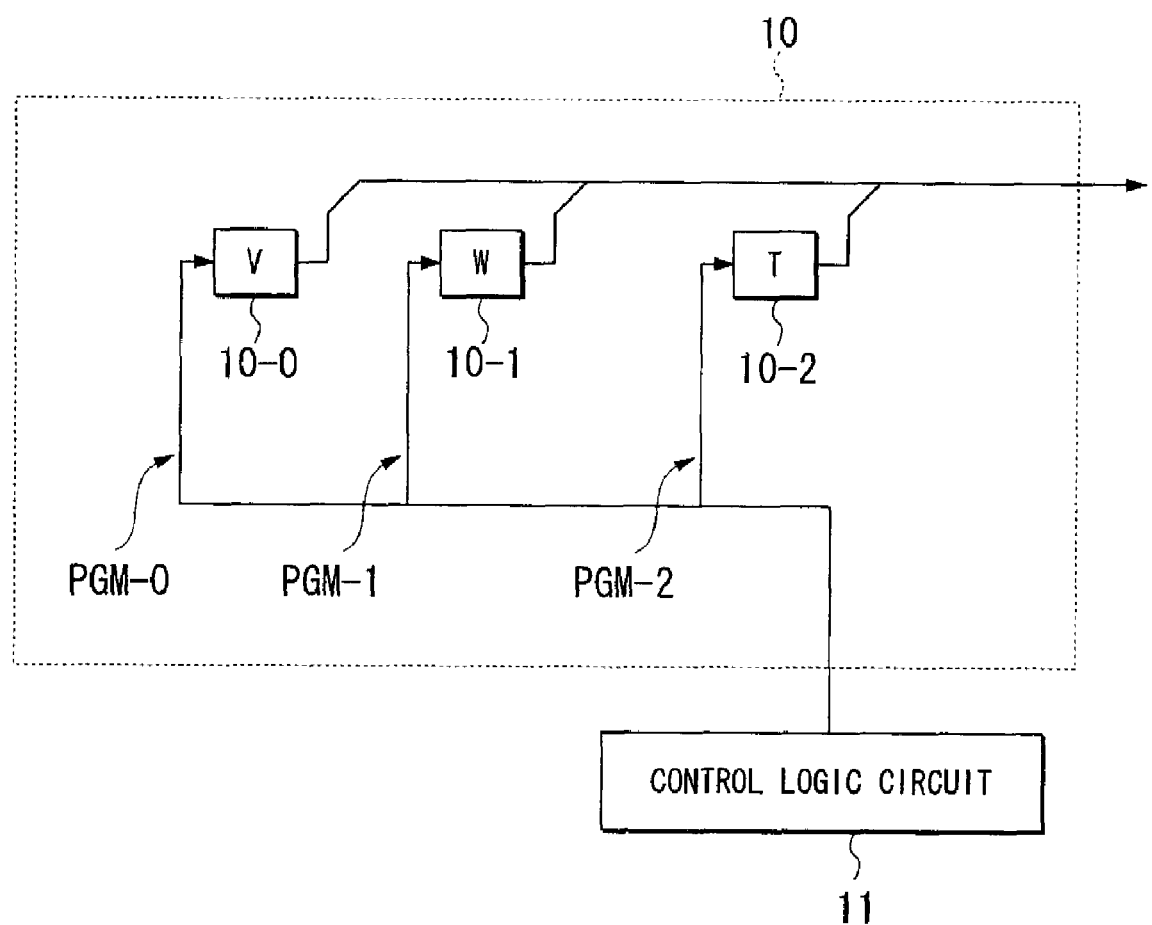
FIG. 12 is a block diagram of a fuse circuit provided in a semiconductor device according to the conventional art.
Figure 13:
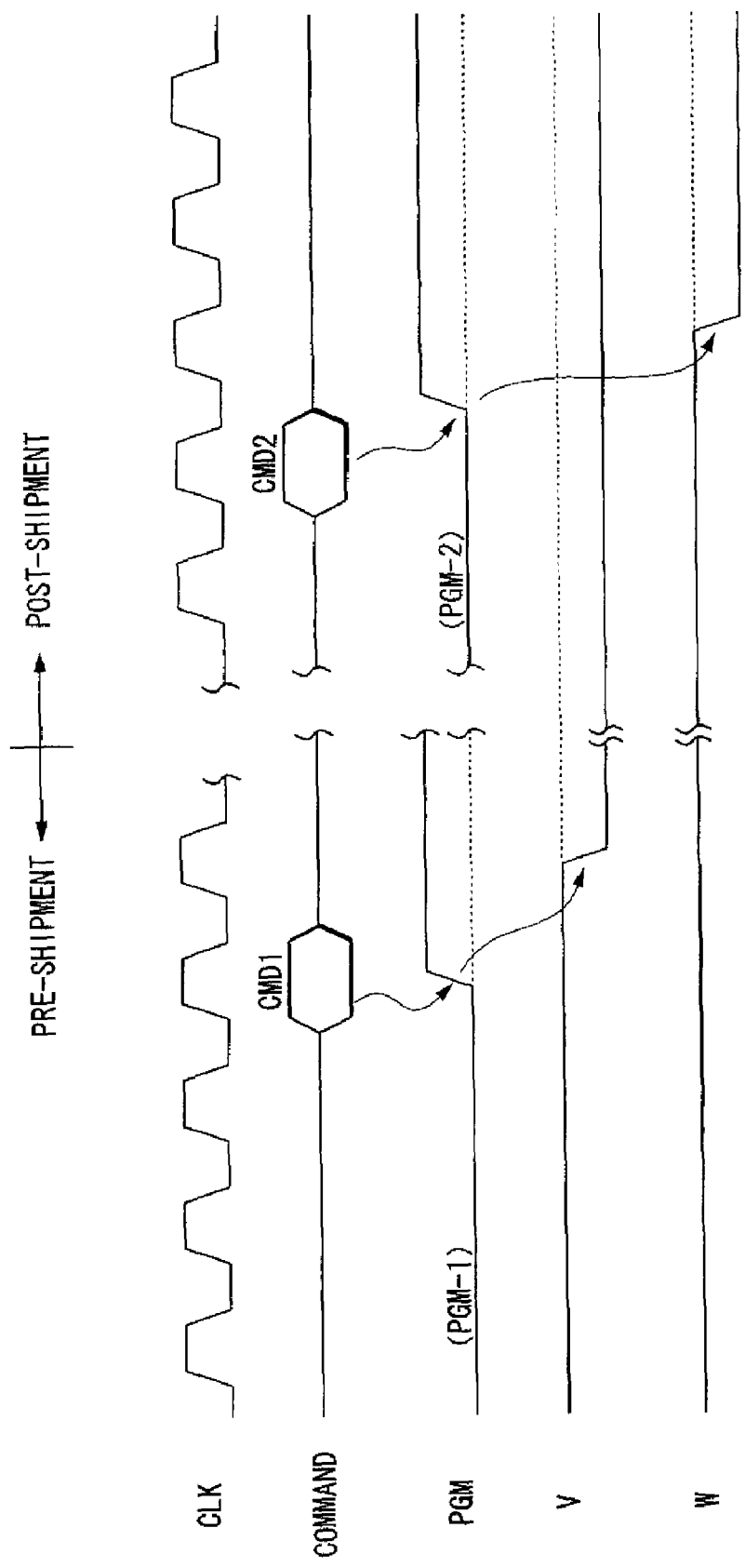
FIG. 13 is a timing chart to explain the operation of the semiconductor device according to the conventional art.

A fourth embodiment of the present invention will be described with reference to FIG. 11. The fourth embodiment is in the configuration of the fuse circuits according to the above-described second embodiment shown in FIG. 9, instead of the plurality of unit blocks 920A, a plurality of unit blocks 920C comprising the fuse element circuits 921 and 923 (a plurality of fuse circuits for storing a plurality of data for defining a plurality of circuit configurations) are provided, and a part of the plurality of fuse blocks 920C among the plurality of unit blocks 910B and the plurality of unit blocks 920C share one fuse element circuit 960. The rest of the structure is the same as that of the second embodiment.

Sharing one fuse element circuit 960 by a plurality of fuse blocks 920C in a part of the unit blocks 920C in this way make it possible for the rest of the plurality of unit blocks 910B to be kept in a programmable state while misprogramming of the plurality of unit blocks 920C can be prevented. Furthermore, this structure can simplify the configuration of the fuse block 920C.

While preferred embodiments of the invention have been described and illustrated above, it should be understood that these are exemplary of the invention and are not to be considered as limiting. Modifications can be made without departing from the spirit or scope of the present invention. For example, in the above-described preferred embodiments, an MOS transistor was cited and described as an example of an anti-fuse. However, the anti-fuse is not limited thereto, and nonvolatile storage elements such as a flash memory and an EPROM, electric fuses and the like can be used. Moreover, although in the above-described preferred embodiments, a case in which the present invention is applied to a semiconductor memory has been described as an example, it is also possible to apply the present invention to logic products such as a CPU (Central Processing Unit), an FPLD (Field Programmable Logic Device) or the like.

Further, in the above-described first embodiment, for example, the fuse element circuit 913 for storing the program inhibition data is to be programmed by the program signal SB provided from the control logic circuit 140 through the AND gate circuit 914. However, when the fuse element circuit 913 is composed of an anti-fuse of a destructive type, the program signal SB may be directly provided from the control logic circuit 140 to the fuse element circuit 913. In this case, the fuse element circuit 913 which has been programmed once will not lose the data stored therein even if it might be misprogrammed afterwards. Consequently, the function to prevent misprogramming of the group of fuse element circuits 911 will not be lost. The same statements are true for the other embodiments.

Still further, in the above-described embodiments, the unit block 910A for defective remedy, and unit blocks 920A for adjusting the word organization, the voltage of the internal electrical power source, and the operating timing, respectively were cited and described as examples. However, unit blocks are not limited thereto, and any unit block may be provided according to demand, and another optional unit block may be added. In the above-described embodiments, a case in which ×8-bit organization is modified to ×4-bit organization was cited and described as an example. However, the word organization is not limited thereto, and the invention may be extended such that the word organization is modified arbitrarily. Still further, in the above-described embodiments, the anti-fuses of destructive type were used for the group of fuse element circuits 911. However, it is not limited thereto, and another fuse may also be used. Furthermore, in the above-described embodiments, the semiconductor device of the present invention was described such that the circuit configuration is definable in the fuse circuits. However, the semiconductor device of the present invention includes those in which the circuit is programmable, modifiable, changeable, or the like.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A semiconductor device comprising:
   a first fuse circuit;
   a second fuse circuit;
   a program control circuit performing, when allowed, a programming operation on the first fuse circuit; and
   a gate circuit allowing the program control circuit to perform the programming operation on the first fuse circuit when the second fuse circuit produces a first level and inhibiting the program control circuit from performing the programming operation on the first fuse circuit when the second fuse circuit produces a second level,
   wherein the second fuse circuit is programmed from the first level to the second level before the first fuse circuit has been programmed,
   wherein the device further comprises a third fuse circuit, and a fourth fuse circuit, the program control circuit performs, when allowed, a programming operation on the third fuse circuit, the device further comprising an additional gate circuit allowing the program control circuit to perform the programming operation on the third fuse circuit when the fourth fuse produces the first level and inhibiting the program control circuit from performing the programming operation on the third fuse circuit when the fourth fuse circuit produces the second level, the fourth fuse circuit being programmed from the first level to the second level after the third fuse circuit has been programmed.

2. The semiconductor device according to claim 1, wherein the first fuse circuit stores, when programmed by the program control circuit, a defective address.

3. The semiconductor device according to claim 1, wherein the first fuse circuit stores, when programmed by the program control circuit, circuit configuration data regarding a word organization of an output data of the semiconductor device.

4. The semiconductor device according to claim 1, wherein the first fuse circuit stores, when programmed by the program control circuit, circuit configuration data regarding a voltage of an internal electrical power source of the semiconductor device.

5. A semiconductor device comprising:
   a first fuse circuit;
   a second fuse circuit,
   a program control circuit performing, when allowed, a programming operation on the first fuse circuit; and
   a gate circuit inhibiting the program control circuit from performing the programming operation on the first fuse circuit when the second fuse circuit has been programmed to produce a second level,
   wherein the second fuse circuit is programmed from the first level to the second level before the first fuse circuit has been programmed,
   wherein the gate circuit allows the program control circuit to perform the programming operation on the first fuse circuit when the second fuse circuit has not been programmed to produce a first level,
   wherein the device further comprises a third fuse circuit, and a fourth fuse circuit, the program control circuit performs, when allowed, a programming operation on the third fuse circuit, the device further comprising an additional gate circuit inhibiting the program control circuit from performing a programming operation on the third fuse circuit when the fourth fuse circuit has been programmed to produce the second level, the fourth fuse circuit being programmed from the first level to the second level after the third fuse circuit has been programmed.

6. The semiconductor device according to claim 5, wherein the third fuse circuit stores, when programmed by the program control circuit, circuit configuration data regarding a word organization of an output data of the semiconductor device.

7. The semiconductor device according to claim 1, wherein the third fuse circuit stores, when programmed by the program control circuit, a defective address.

8. The semiconductor device according to claim 1, wherein the third fuse circuit stores, when programmed by the program control circuit, circuit configuration data regarding a word organization of an output data of the semiconductor device.

9. The semiconductor device according to claim 1, wherein the third fuse circuit stores, when programmed by the program control circuit, circuit configuration data regarding a voltage of an internal electrical power source of the semiconductor device.

10. The semiconductor device according to claim 2, wherein the third fuse circuit stores, when programmed by the program control circuit, an additional defective address.

* * * * *